(12) United States Patent
Dang et al.

(10) Patent No.: US 10,330,701 B2
(45) Date of Patent: Jun. 25, 2019

(54) TEST PROBE HEAD FOR FULL WAFER TESTING

(71) Applicant: International Business Machines Corporation, Armonk, NY (US)

(72) Inventors: Bing Dang, Chappaqua, NY (US); Yu Luo, Hopewell Junction, NY (US); John Knickerbocker, Monroe, NY (US); Yang Liu, Ossining, NY (US); Steven L. Wright, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 162 days.

(21) Appl. No.: 14/962,331

(22) Filed: Dec. 8, 2015

(65) Prior Publication Data

US 2016/0084882 A1    Mar. 24, 2016

Related U.S. Application Data

(63) Continuation-in-part of application No. 14/708,198, filed on May 9, 2015, and a continuation-in-part of
(Continued)

(51) Int. Cl.
*G01R 1/073* (2006.01)
*G01R 31/28* (2006.01)
(Continued)

(52) U.S. Cl.
CPC .......... *G01R 1/07314* (2013.01); *B23K 35/00* (2013.01); *B81C 1/00111* (2013.01);
(Continued)

(58) Field of Classification Search
CPC .. G01R 1/07307; G01R 1/07385; G01R 1/36; G01R 3/00; G01R 31/2601; G01R 31/2889
See application file for complete search history.

(56) References Cited

U.S. PATENT DOCUMENTS 4,088,544 A    5/1978  Hutkin
5,114,543 A    5/1992  Kajiwara et al.
(Continued)

OTHER PUBLICATIONS

Reid, J., McKerrow, A., Varadarajan, S. and Kozlowski, G., "Copper electroplating approaches for 16nm technology," Solid State Technology 53(5), 14-16 (2010).
(Continued)

*Primary Examiner* — Tung X Nguyen
(74) *Attorney, Agent, or Firm* — Law Office of Charles W. Peterson, Jr.; Louis J. Percello, Esq.

(57) ABSTRACT

A test probe head for probe testing multiple chips on a wafer in a single probing. A probe head substrate includes an array of probe tip attach pads on one surface. The array includes a subarray for each probe head chip test site. Probe tips attached to each probe tip attach pad have an across the head tip height variation less than one micrometer (1 μm). The subarray probe tips may be on a pitch at or less than fifty microns (50 μm). The test probe head may be capable of test probing all chips in a quadrant and even up to all chips on a single wafer in a single probing.

20 Claims, 6 Drawing Sheets

Related U.S. Application Data application No. 14/516,963, filed on Oct. 17, 2014, now Pat. No. 9,391,040, and a continuation-in-part of application No. 14/187,237, filed on Feb. 22, 2014, now Pat. No. 9,070,586.

(51) Int. Cl.
*B23K 35/00* (2006.01)
*H01L 23/00* (2006.01)
*B81C 1/00* (2006.01)

(52) U.S. Cl.
CPC .......... *G01R 31/2886* (2013.01); *H01L 24/11* (2013.01); *H01L 24/14* (2013.01); *H01L 24/92* (2013.01); *H01L 24/05* (2013.01); *H01L 24/06* (2013.01); *H01L 24/13* (2013.01); *H01L 24/16* (2013.01); *H01L 24/32* (2013.01); *H01L 24/81* (2013.01); *H01L 24/83* (2013.01); *H01L 2224/0401* (2013.01); *H01L 2224/04042* (2013.01); *H01L 2224/05082* (2013.01); *H01L 2224/05147* (2013.01); *H01L 2224/05155* (2013.01); *H01L 2224/05644* (2013.01); *H01L 2224/06131* (2013.01); *H01L 2224/06135* (2013.01); *H01L 2224/06136* (2013.01); *H01L 2224/111* (2013.01); *H01L 2224/11003* (2013.01); *H01L 2224/1112* (2013.01); *H01L 2224/11334* (2013.01); *H01L 2224/11849* (2013.01); *H01L 2224/131* (2013.01); *H01L 2224/136* (2013.01); *H01L 2224/13017* (2013.01); *H01L 2224/1357* (2013.01); *H01L 2224/1366* (2013.01); *H01L 2224/13083* (2013.01); *H01L 2224/13111* (2013.01); *H01L 2224/13147* (2013.01); *H01L 2224/13155* (2013.01); *H01L 2224/13562* (2013.01); *H01L 2224/13655* (2013.01); *H01L 2224/13657* (2013.01); *H01L 2224/13663* (2013.01); *H01L 2224/14051* (2013.01); *H01L 2224/14181* (2013.01); *H01L 2224/16227* (2013.01); *H01L 2224/2919* (2013.01); *H01L 2224/32225* (2013.01); *H01L 2224/73204* (2013.01); *H01L 2224/81005* (2013.01); *H01L 2224/81815* (2013.01); *H01L 2224/83104* (2013.01); *H01L 2224/92* (2013.01); *H01L 2224/92222* (2013.01); *H01L 2924/014* (2013.01); *H01L 2924/01022* (2013.01); *H01L 2924/01028* (2013.01); *H01L 2924/01029* (2013.01); *H01L 2924/14* (2013.01); *H01L 2924/381* (2013.01)

(56) References Cited

U.S. PATENT DOCUMENTS

| | | | |
|---|---|---|---|
| 5,225,771 A * | 7/1993 | Leedy | G01R 1/0735 257/E21.526 |
| 6,346,335 B1 | 2/2002 | Chen et al. | |
| 6,924,043 B2 | 8/2005 | Suzuki et al. | |
| 7,045,442 B2 | 5/2006 | Maruyama et al. | |
| 7,105,448 B2 | 9/2006 | Takayama et al. | |
| 7,363,705 B2 | 4/2008 | Kim et al. | |
| 7,927,971 B2 | 4/2011 | Tamura et al. | |
| 9,372,227 B2 * | 6/2016 | Wang | G01R 31/2889 |
| 2002/0047721 A1 * | 4/2002 | Mikami | G01R 1/06761 324/754.07 |
| 2002/0089341 A1 * | 7/2002 | Hubner | G01R 31/31851 324/756.03 |
| 2006/0091510 A1 * | 5/2006 | Liu | G01R 31/2889 257/678 |
| 2009/0174423 A1 * | 7/2009 | Klaerner | B82Y 30/00 324/754.07 |
| 2009/0243126 A1 | 10/2009 | Washiya et al. | |
| 2012/0279287 A1 | 11/2012 | Andry et al. | |
| 2014/0035609 A1 * | 2/2014 | Huang | G01R 1/073 324/755.01 |

OTHER PUBLICATIONS

Naoya Watanabe et al., "Pyramid Bumps for Fine-Pitch Chip-Stack Interconnection," Japanese Journal of Applied Physics vol. 44, No. 4B, 2005, pp. 2751-2755.

Liu et al., "Planarity-Tolerant Fine-pitch Reworkable Interconnections with Sharp Protrusions and Microbumps," Proceedings—Electronic Components and Technology Conference—May 2015.

* cited by examiner

TEST PROBE HEAD FOR FULL WAFER TESTING

CROSS REFERENCE TO RELATED APPLICATION

The present invention is a continuation in part (CIP) of: of U.S. Pat. No. 9,070,586, "METHOD OF FORMING SURFACE PROTRUSIONS ON AN ARTICLE AND THE ARTICLE WITH THE PROTRUSIONS ATTACHED" filed Feb. 22, 2014, and issued Jun. 30, 2015; U.S. patent application Ser. No. 14/516,963, "PLANARITY-TOLERANT REWORKABLE INTERCONNECT WITH INTEGRATED TESTING" filed Oct. 17, 2014; and of U.S. patent application Ser. No. 14/708,198, "METHOD OF FORMING SURFACE PROTRUSIONS ON AN ARTICLE AND THE ARTICLE WITH THE PROTRUSIONS ATTACHED" filed May 9, 2015, all to Bing Dang et al., all assigned to the assignee of the present invention and incorporated herein by reference.

BACKGROUND

Field of the Invention

The present invention is related to semiconductor device manufacturing and testing, and more particularly to a test probe head for full wafer testing multiple integrated circuit (IC) chips on semiconductor wafers.

Background Description

Typical semiconductor integrated circuit (IC) chips have layers stacked such that layer features overlay one another to form individual devices and connect devices together. ICs are mass produced by forming an array of chips on a thin semiconductor wafer. Each array location is known as a die. A typical, state of the art wafer may be as large as a dinner plate or larger, e.g., 12 inches (300 millimeters or 300 mm), with projections for 18 inch (450 mm) wafers in the near future. Larger wafers allow for more die per wafer for a given die size. At the same time increased logic complexity requires a higher input/output (I/O) count.

Each die may harbor a multilayered structure, such as an IC chip or a structure for test or alignment. The surface layer of each completed chip or die is typically populated by probe-able off-chip pads for connecting to chip power and input/output (I/O) signals. Packing more function on each die typically means providing more and more I/O signals for each die, on one (a top) surface, or for a three dimensional (3D) chip structure, both (top and bottom) surfaces. Each die has at least one surface pad for each I/O signal and a number of power (supply and ground) connection pads. Increasing I/O signal and supply pad count for a given die size requires a tighter I/O pad pitch for dense I/O pad arrays, and correspondingly, a tighter test probe pitch. A typical state of the art IC wafer, for example, die may be populated by several thousand connection pads on very tight a pitch less than 50 microns (<50 μm).

Testing these tightly packed pads with or without solder balls requires very fine, delicate, tightly-packed test probes. Historically, what are known as cobra probes were used to probe down to 150 μm. Probing tightly-packed pads at 50 μm and below requires very precise probe tip geometry control and scalability. Achieving necessary probe tip precision for probing ultra-fine pitch pads has proven very difficult, and therefore, expensive. Moreover, in addition to increasing test time, repetitively shifting from one die to the next during manufacturing test, tends to degrade probe quality for these very fine, delicate, tightly-packed test probes.

Previously, multisite testing was unavailable for wafers populated by logic complex chips. Large probe heads, especially wafer level probe heads, could be used for testing low pin count memory chips, where it may be relatively easy to make contact to multiple memory dies simultaneously. However, these large probe head test cards were very expensive to build and to maintain. Moreover, these large probe heads have been limited to low pin count applications, which made the probes unattractive for high input/output (I/O) count logic chips. The poor precision of these traditional probes has made high pin count probe heads unsuitable, especially when considering the level of probe force that may be required to contact all of chip pads for chips under test.

Thus, there is a need for low cost multi-chip test probes for probing those ultra-fine pitch pads and bumps on wafers with state of the art IC chips, and in addition for probing those ultra-fine pitch pads and bumps on state of the art logic chips in a single probing.

SUMMARY

A feature of the invention is a multi-chip test probe for wafer level probing multi-chip locations in a single probing;

Another feature of the invention is an inexpensive multi-chip test probe for wafer level probing all chip locations in at least a quadrant of a wafer in a single probing;

Yet another feature of the invention is an inexpensive multi-chip test probe for wafer level probing all chip locations on a wafer in a single probing.

The present invention relates to a test probe head for probe testing multiple chips on a wafer in a single probing. A probe head substrate includes an array of probe tip attach pads on one surface. The array includes a subarray for each probe head chip test site. Probe tips attached to each probe tip attach pad have an across the head tip height variation less than one micrometer or micron (1 μm). The subarray probe tips are on a pitch ranging from one micron to one millimeter (1 μm-1 mm), and preferably, at or less than fifty microns (50 μm). The test probe head may be capable of test probing all chips in a quadrant and even up to all chips on a single wafer in a single probing.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION

Turning now to the drawings and, more particularly, FIGS. 1A-G show a cross-sectional and plan view example 100 of forming surface protrusions or probe head tips in a large body 10 for a wafer level test probe, according to a preferred embodiment of the present invention. A preferred wafer level test probe may be used for functional testing multiple logic chips or devices under test (DUTs) on a large wafer area, e.g., wafer quadrant or even a whole wafer, at once in parallel in the time frame of a single functional test.

While the probe tips may be formed for a preferred test probe using any suitable transferrable tip formation process, as described herein, the tips and test probes are formed substantially as described in U.S. Pat. No. 9,070,586, "METHOD OF FORMING SURFACE PROTRUSIONS ON AN ARTICLE AND THE ARTICLE WITH THE PROTRUSIONS ATTACHED", filed Feb. 22, 2014, and issued Jun. 30, 2015; in U.S. patent application Ser. No. 14/516, 963, "PLANARITY-TOLERANT REWORKABLE INTERCONNECT WITH INTEGRATED TESTING" (herein Reworkable Interconnect), filed Oct. 17, 2014; and in U.S. patent application Ser. No. 14/708,198, "METHOD OF FORMING SURFACE PROTRUSIONS ON AN ARTICLE AND THE ARTICLE WITH THE PROTRUSIONS ATTACHED" (herein Surface Protrusions II), filed May 9, 2015, all to Bing Dang et al., and assigned to the assignee of the present invention.

A preferred multi-chip probe head has application to simultaneously testing multiple state of the art electronics chips, such as the Internet of Things (IoT) device and wearable device chips, manufactured on ultra-thin wafers. These thin wafers are characterized by large quantities (hundreds to thousands or more) of dies with small, tightly packed signal and power supply pads. Thus, for such a wafer even a single quadrant may include hundreds, thousands or more chip pads, e.g., 700,000 pads, for functional test. A preferred a test probe assembly has equally tightly packed probes with high co-planarity such that all the probes contact all test points for all of the multiple DUTs even with low probe force. Thus, the preferred multi-chip test probe structure (e.g., probes, probe head and connecting interposer(s)) lends itself to high pin count applications, up to and including, for full wafer level functional testing.

Figure 1A:
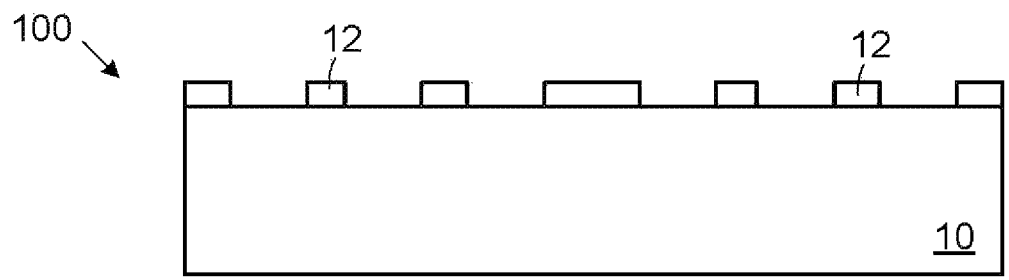
FIGS. 1A-G show a cross-sectional and plan view example of forming surface protrusions or probe head tips in a large body for a wafer level test probe according to a preferred embodiment of the present invention.
Figure 1B:
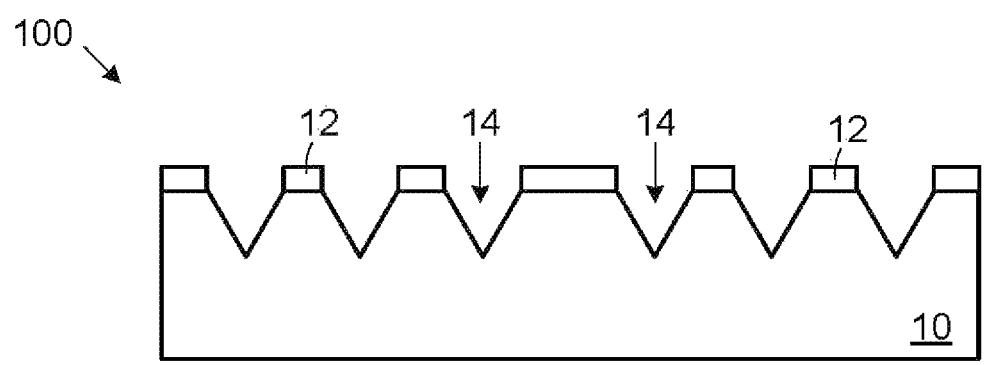

So formation begins in FIG. 1A, by forming a mask 12 on a preferred large body or template wafer 10 that defines pits 14 at protrusion locations in FIG. 1B. Preferably the etched template wafer 10, which may be reusable, is a silicon with prismic, conical, cylindrical or pyramidal pits 14. In this example, the pits 14 have an inverted pyramid shape with a square base and equilateral triangle shaped sides. Preferably also, the pits 14 are 1-25 μm deep, and most preferably 8 μm deep, with a surface diagonal/diameter 1-50 μm, most preferably 14 μm.

The pits 14 may be opened using any well-known semiconductor pattern and etch process, e.g., such as is used for trench formation in deep or shallow trench isolation (STI). Although any suitable wet or dry etch may be used, preferably, an anisotropic wet etch using Tetramethylammonium hydroxide (TMAH or TMAOH), etches the pyramidal pits 14 in the surface of silicon wafer 10. Further, the pits 14 are scalable down to any size and any pitch, depending upon the particular pattern and etch technology selected.

Figure 1C:
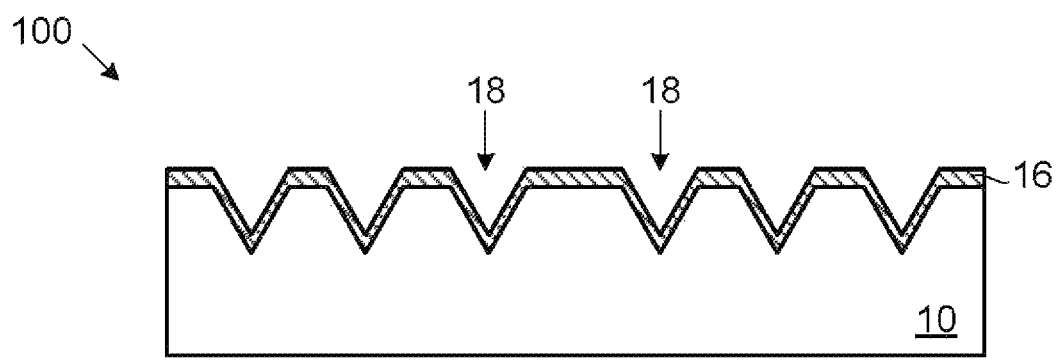

In FIG. 1C, after removing the mask pattern 12, a low adhesion surface or seed layer 16 covers the pitted wafer 10, coating each probe pit 18 to provide a non-planar surface. Preferably, the low adhesion seed layer 16 is a multi-layer (not shown) metal layer. In a particular example, the layers may include a base layer, e.g., titanium, formed directly on the template wafer 100 to ensure good adhesion to the silicon substrate 10. A highly conductive layer, e.g., copper (Cu), silver (Ag) or gold (Au), formed on base layer ensures uniform current distribution, to maintain current stability during electroplating. A surface layer of seed material, e.g., Ti, is formed on highly conductive layer. Native oxide (also not shown) forms on the Ti surface to ensure sufficiently low adhesion to the Ti surface layer and to allow subsequently separating the electroplated material from the low adhesion seed layer 16 with relatively low force.

The coated pits 18 provide a non-planar surface that, during plating, causes local current crowding in each pit 18 to facilitate nucleation in the pit 18 without risking current stability. The surface non-linearity or other surface roughness, pits in this example, also facilitates plating nucleation, maintains adherence of subsequently plated metal to the template wafer during plating, and with sufficiently low adhesion to release the plated material with relatively low force. Other suitable seed materials may include, for example, stainless steel and chromium (Cr). Alternately, the low adhesion seed layer 16 may be a single metal layer, that layer sufficiently adheres to the silicon substrate 10 and provides sufficiently uniform plating current distribution.

Figure 1D:
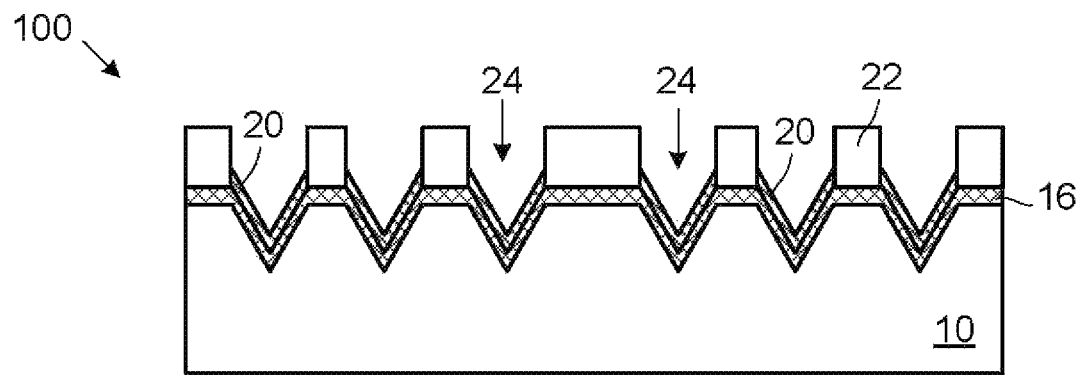

In FIG. 1D, a sacrificial mask pattern 22 is formed on the low adhesion seed layer 16 around the probe pits 14, such that only selected pit 18 surface areas remain exposed for electroplating. Electroplating first forms a capping material layer 20 on exposed portions of low adhesion seed layer 16 to form inverted metal protrusions or bumps in the respective capped pits 24. Preferably, a capping material layer forms a hard tip cap 20 for each probe tip, electroplated to the low adhesion seed layer 16. The hard caps 20 cover the low adhesion seed layer 16, and completely line the pits 24. Preferably, the capping material is nickel (Ni), cobalt (Co), iron (Fe), suitable refractory metal or an alloy thereof, electroplated to a thickness of 1-30 μm, preferably 5 μm. The patterned sacrificial layer 22 also defines protrusion locations or bases that extend above each capped pit 24.

Figure 1E:
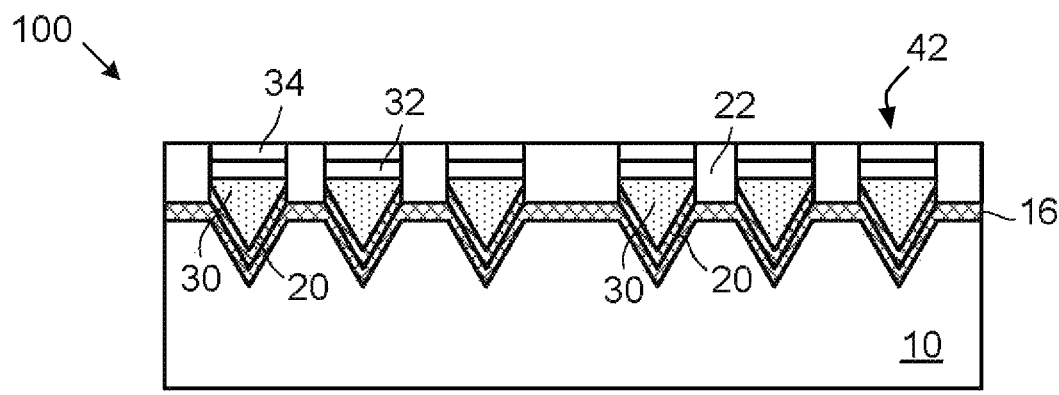

In FIG. 1E, a conductive plug 30, e.g., copper, is plated to the hard caps 20, such that the plated copper plug 30 has a minimum thickness of 1-100 μm, preferably 10 μm. Next, a base layer 32, preferably nickel, is electroplated to the conductive plug 30, and attach material 34, preferably, lead-free solder, such as a tin/silver (Sn/Ag) solder, is electroplated to the base layer 32. In this example, the base layer 32 is 0.5-3 μm, preferably 2 μm, thick; and the attach material 34 is 1-100 μm, preferably 10 μm, thick. Also in this example, the inverted metal protrusions 42 completely fill each pit.

Figure 1F:
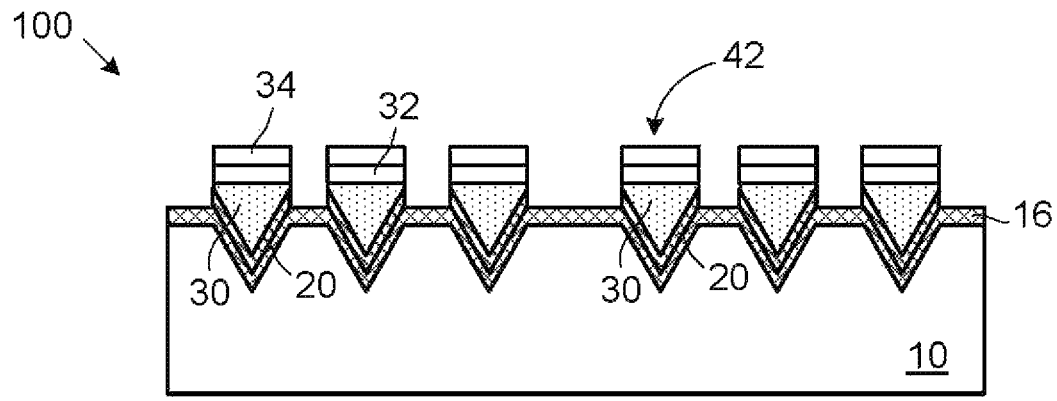

Removing the patterned sacrificial layer 22 in a typical wet strip, rinse, and dry, exposes the inverted probe tips 42 in FIG. 1F. Even though adhesion is low, the low adhesion seed layer 16 still has sufficient adhesion to hold the features (inverted probe tips 42) in place when the sacrificial layer 22 is stripped.

Figure 1G:
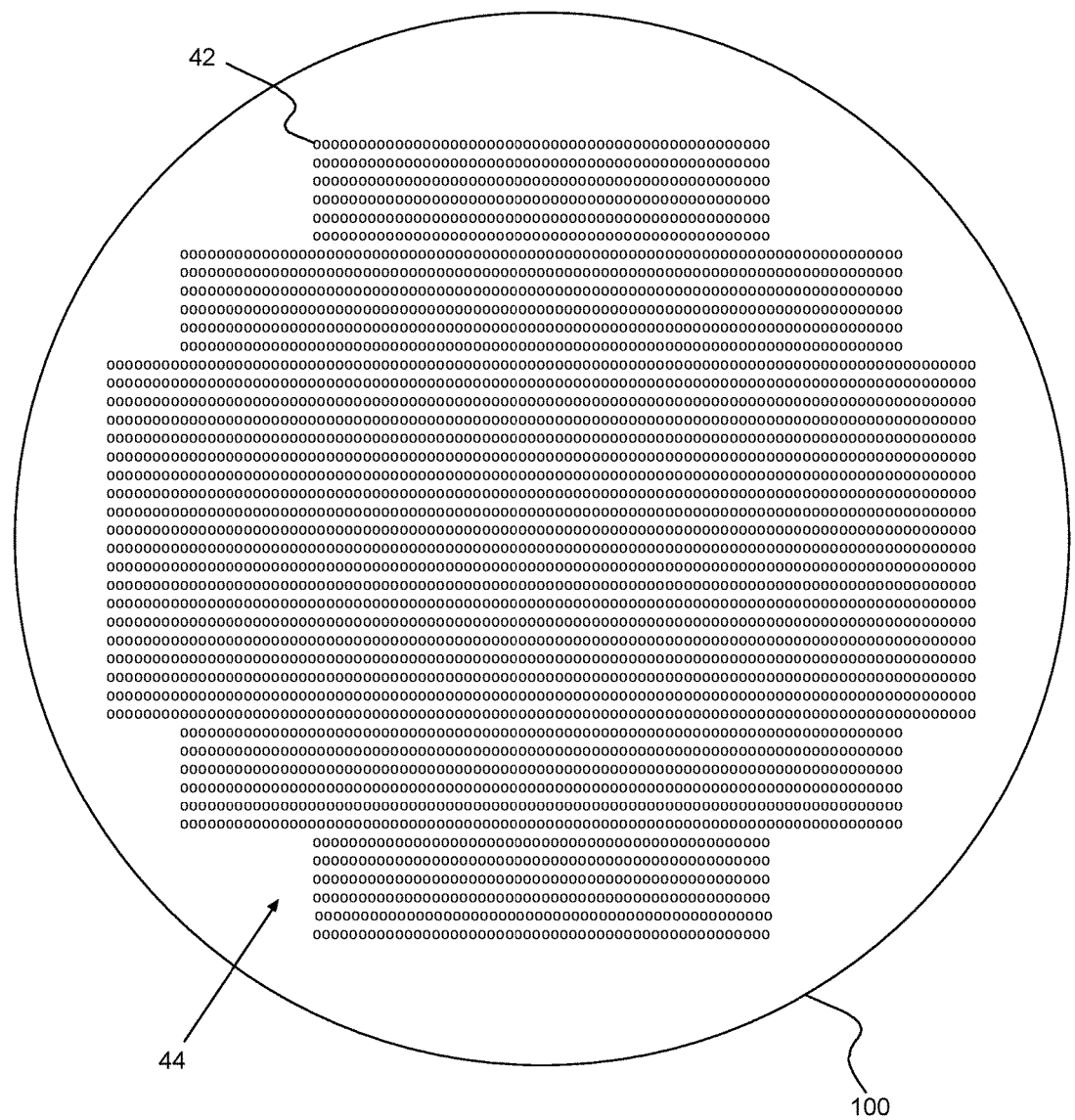

FIG. 1G shows a plan view example of a wafer probe array 44 of inverted probe tips 42 formed on the silicon template wafer 100 as described in FIGS. 1A-F. The sub-array probe tips are on a pitch ranging from one micron to one millimeter (1 μm-1 mm). In this example, the mounted probe tips 42 may be on a pitch at, or less than, fifty microns (<50 μm). It should be noted that although shown here as a uniform array 44 of probe tips 42, this is for example only. The array may have blank locations, for example, at chip corners and between die locations. Between die, for example, the blanks divide the array 44 into subarrays, one (1) for each chip. Thus, the typical array 44 may be customized for the particular chips/wafer to be tested. Alternately, a common uniform array 44 may be attached to a suitable custom structure that accepts probes for the particular chips/wafer to be tested with the unused tips 42 remaining behind on the template wafer 100 when it is removed. With the probe array 44 attached to a suitable semiconductor structure and the template removed, the assembly provides a probe head for a multi-chip, or even up to a full wafer level, test probe for functionally testing logic chips prior to dice and mounting. In particular, such a wafer level test probe provides for testing wafers with a large number of dies with tightly spaced pads and a high degree of parallelism, testing multiple die simultaneously in parallel.

Figure 2:
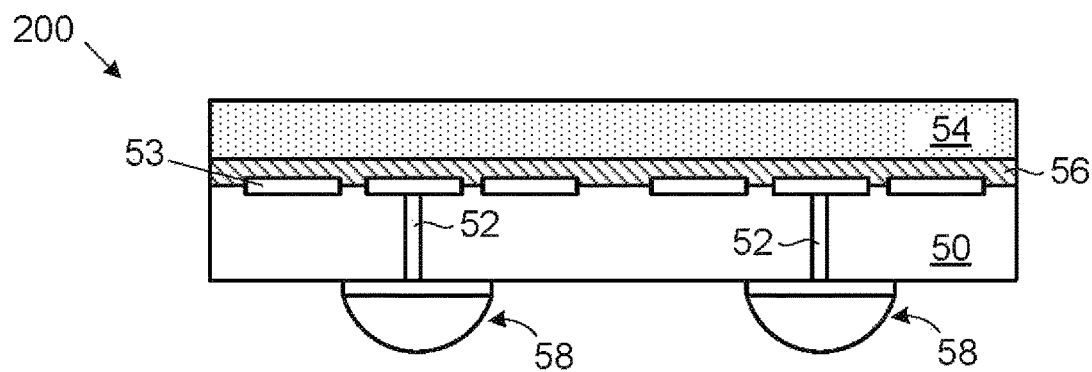
FIG. 2 shows an example of a suitable semiconductor structure including a probe head layer for mounting an array of inverted probe tips.

FIG. 2 shows an example of a suitable semiconductor structure 200 for mounting an array of inverted probe tips, e.g., 42 in wafer probe array 44 of FIG. 1G. An example of forming a suitable semiconductor structure 200 is described in Reworkable Interconnect. In this example, the semiconductor structure 200 includes a substrate or probe head layer 50 that may include a functional 2.5D or 3D layer. Preferably, the probe head layer 50 includes active test circuitry for testing and monitoring IC chips during multi-chip or multi-site testing. Also, in one embodiment, the probe head layer 50 may include a 3D silicon or glass die containing interconnect structures 52 or pass-through vias. The probe head layer 50 may have a thickness ranging from approximately 10 μm to approximately 1,000 μm. The interconnect structures 52 may include, for example, through-silicon vias (TSVs), through-glass vias (TGVs). The probe head layer 50 may include a surface pad 53 that allows connecting the probe head layer 50 to additional substrates or semiconductor structures with active test circuitry, as also described in Reworkable Interconnect.

The probe head layer 50 may be attached to a carrier substrate 54, e.g., a silicon or glass wafer, by an adhesion layer 56. The adhesion layer 56 may include, for example, a suitable adhesive material. The carrier substrate 54 may serve to transfer or move the probe head layer 50 for additional semiconductor processes including bonding to another semiconductor structure or substrate. The probe head layer 50 may further include solder bumps 58 formed on one surface of the probe head layer 50 using a typical, Integrated Circuit (IC) chip bumping technique, well known to those skilled in the art.

Figure 3:
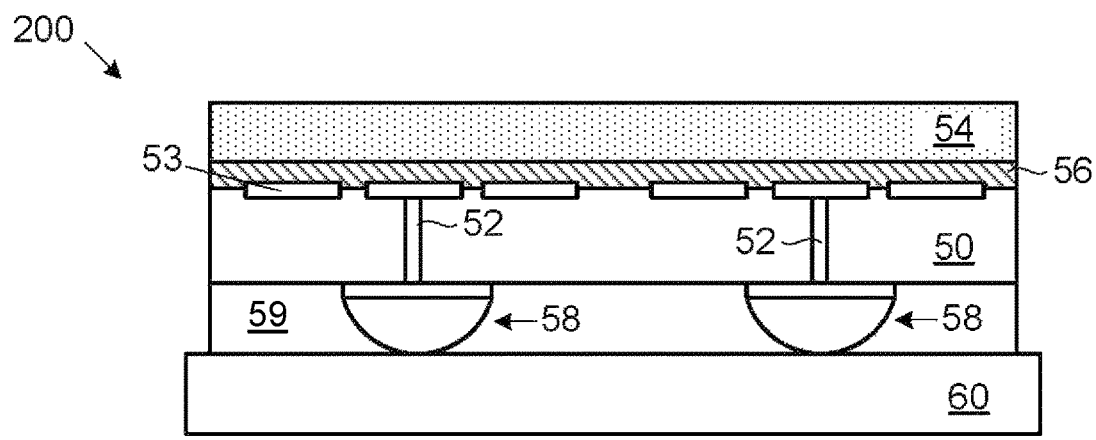
FIG. 3 shows an example of the probe head layer with solder bumps 50 for joining to an interposer substrate or handle wafer.

After forming solder bumps 58, as shown in the example of FIG. 3, the probe head layer 50 may be joined to an interposer substrate 60 at the solder bumps 58, the carrier substrate 54 as a handle wafer. The interposer substrate 60 may be of a material including, for example, ceramic, organic, glass, or silicon with one or more redistribution and/or logic layers. The probe head layer 50 may be bonded or joined to the interposer substrate 60 by reflowing the solder bumps 58. Optionally, a non-conductive underfill layer 59 may be applied to fill between the probe head layer 50 and the interposer substrate 60, for improved stack reliability and mechanical properties.

Figure 4:
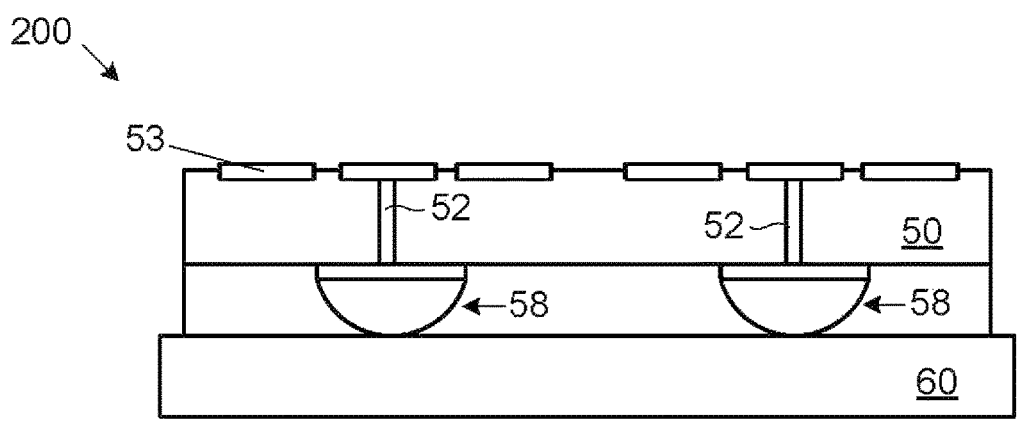
FIG. 4 shows an example of the probe head layer after removing the carrier substrate and adhesion layer to expose the surface pads.

Next, the carrier substrate 54 and the adhesion layer 56 are removed from the probe head layer 50 to expose the surface pads 53, as shown in FIG. 4. Again it should be noted that the surface pads 53 are customized for the particular chips/wafer to be tested and located substantially corresponding to the array 44 of probe tips 42 of FIG. 1G. The surface pad 53 array has blank locations, for example, at chip corners and between die locations. After releasing the carrier substrate 54 and the adhesion layer 56, the probe head layer 50 remains joined to the interposer substrate 60 with the surface opposite the bumps 58 exposed.

Figure 5:
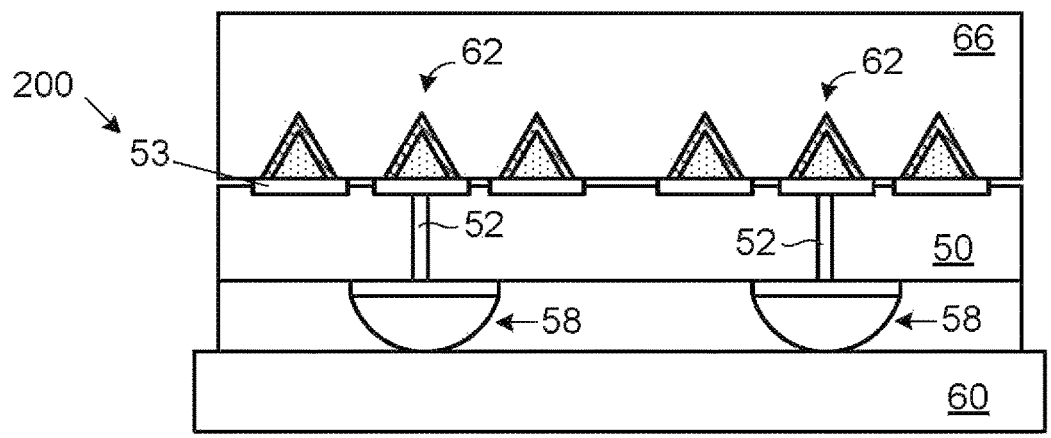
FIG. 5 shows an example of probe tips, still attached to the template substrate, attached to the surface pads on the probe head layer.

As shown in FIG. 5, probe tips 62 attached to a template substrate 66, e.g., array 44 of FIG. 1G, are fixed to the structure 200, attached to the surface pads 53 on the probe head layer 50. Preferably, the probe tips 62 are attached to the surface pads 53, e.g., using a reflow or thermo-compression to bond the probe tips 62 IC to pads 53 on the patterned wafer 66. The IC pads 53 also may be layered pads that include a base layer, preferably copper, on the patterned wafer 66, an interface layer, preferably nickel, on base layer, and anti-oxidation layer, preferably gold, on the interface layer, as described in Surface Protrusions I and II. Finally, heating the wafer 50 assembly reflows the attach material 34 to permanently connect the probe tips 62.

Figure 6:
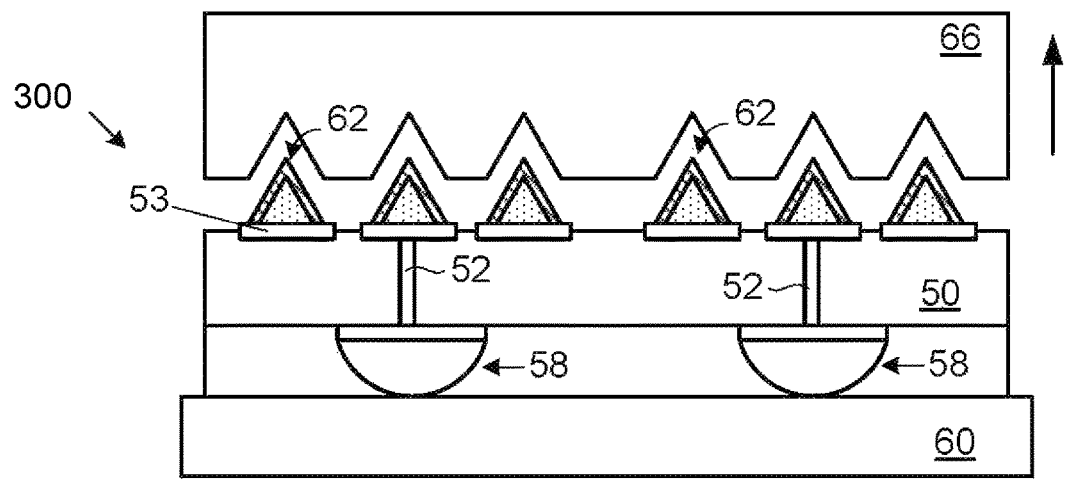
FIG. 6 shows an example of the template substrate being forced off of the probe head layer with the probe tips remaining firmly attached.

Once the probe tips 62 are attached to the IC pads 53, as shown in FIG. 6, the template substrate 66 is separated from the wafer 50. Using very little force the template substrate 66 may be pulled or pried from the probe head layer 300, separating the template substrate 66 from the semiconductor structure, while the probe tips 62 remain attached and in place.

Optionally, the template substrate 66 may be refreshed after removal, first by brushing off any residual process monitoring or measuring protrusions that may remain, e.g., in the Kerf regions. A quick etchant-rinse, e.g., a diluted hydrofluoric acid dip and deionized water rinse, strips oxide from the surface of the low adhesion seed layer. Fresh native oxide regrows in air. After refreshing, the template substrate 66 may be reused to repopulate probe tips 62 for another probe head. Because native oxide is a mono layer the template substrate 66 may be refreshed and reused a number of times, depending on the metal (Ti) thickness, etchant chosen, and process control.

Figure 7:
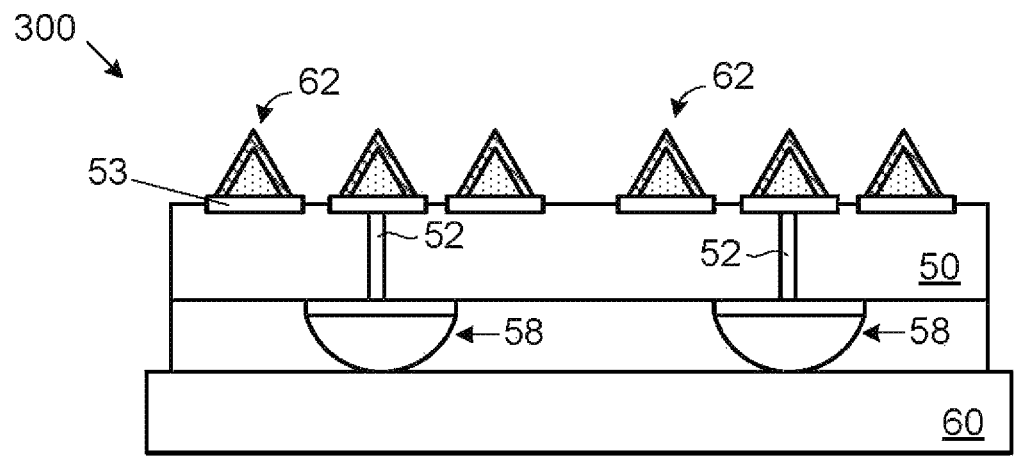
FIG. 7 shows a cross sectional example of completed testing structure for multi-site, or even wafer-level, testing.

FIG. 7 shows a cross sectional example of completed testing structure 300, e.g., for multi-site or even full wafer-level testing. Although shown in this cross sectional example as including 6 probe tips 62 in one direction, this is for example only, Since a typical, larger state of the art logic IC chip, e.g. a CPU, may include a thousand or more I/O pads in a n by m (e.g., 30 by 40 or larger) array. Thus for simultaneously testing several of these chips in a wafer segment, the probe might include hundreds or more probe tips 62 in each direction. Similarly, for simultaneously testing several smaller devices, where the pad array is smaller, the probe might still include hundreds of probe tips 62 in each direction with more chips being tested simultaneously.

For full wafer-level testing of a 300 mm wafer with minimum pitch pads on a 50 μm or closer pitch, some rows might include upwards of 6000 such probe tips 62 and include twelve (12) million or more bumps. Further, although the average IoT application might have only a few hundred of bumps in a very small or tiny footprint, many more of these tiny chips are packed on the same size wafer, e.g., numbering in hundreds to thousands. So, even for these tiny IoT chips, hundreds of pads per die for hundreds to thousands of die results in a high pad count. Further, testing each die individually, it very likely would take more time moving the probe from die to die (raising the probe, moving it to the next die, dropping the probe on the die and testing), than the time spent testing. Thus, testing as many of these small IoT devices in parallel, in a single probing saves substantial test time.

Figure 8:
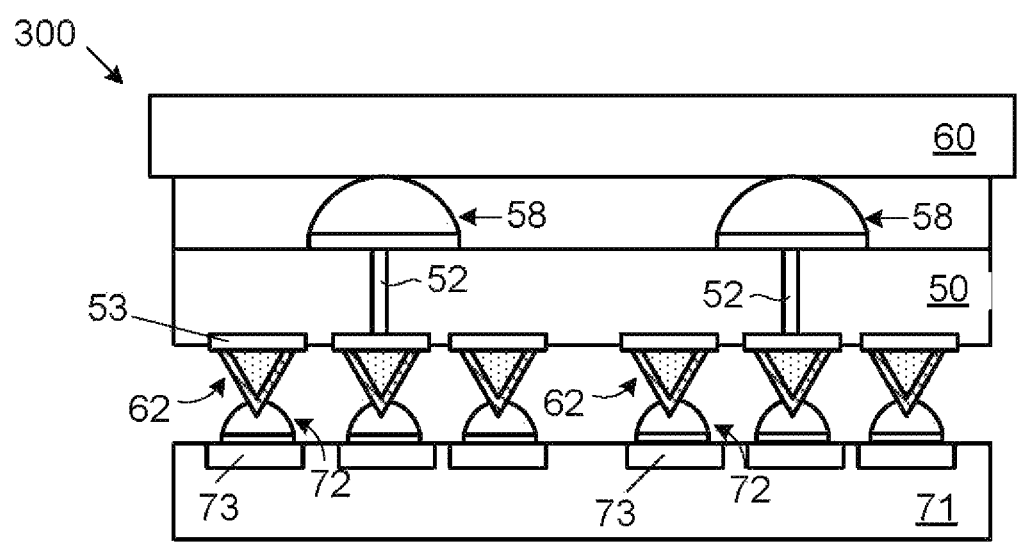
FIG. 8 shows an example of a multi-chip test arrangement using a completed testing structure or probe head.

FIG. 8 shows an example of a multi-chip test arrangement using a completed testing structure 300 or probe head. The probe head 300 is mounted inverted on a test fixture (not shown) for testing multiple devices under test, i.e., sites or chips, on a target substrate or wafer 71 for functional testing of all chips in a single probing. The target substrate 71 may be a full silicon wafer with each DUT including multiple probe-able solder bumps 72 on chip pads 73. Again, it should be noted that the probe head 300 may include test logic, and further, the probe head layer 50 may be the terminal layer in a 3D probe head such as described in Reworkable Interconnect.

Thus advantageously, a preferred probe head exhibits a high level of probe uniformity with across the head tip height variation less than one micrometer (1 μm). Further, probe tips are precisely located with a positional variation also less than one micrometer (1 μm). This tip positional precision and height planarity minimizes the force required to probe multiple chips simultaneously, requiring a probe force of only 100-400 milligrams (100-400 mG) per tip. Moreover, even at this low contact force, each probe tip has a current carrying capability above one amp (1 A) with low contact resistance of forty milliohms (40 mΩ) or less to minimize supply and signal loss (<40 mV). Probe inductance, and corresponding signal distortion, is minimal and minimizes the signal path between test circuitry and the DUT pads, in some cases (e.g., when active test circuitry is integrated into the probe layer) the length of the probe tip. These preferred probes and probe tips may be further scalable, e.g., using micro-bump and micro-pillar technologies.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:

1. A test probe head comprising:
   a probe head substrate;
   an array of probe tip attach pads on one surface of said probe head substrate, said array including a plurality of subarrays; and
   a probe tip attached to each probe tip attach pad, said probe tip having a 1-25 μm tall prismic, conical, cylindrical or pyramidal shaped protrusion, wherein each attached probe tip has a hard cap covering the probe tip.

2. A test probe head as in claim 1, wherein said probe head substrate includes a plurality of chip test sites, said each subarray being in a respective one of said plurality of chip test sites.

3. A test probe head as in claim 2, wherein said probe head substrate is for testing a quadrant on a selected wafer, said selected wafer having a given number of die in each said quadrant, each of said plurality of chip test sites being at one said die in a respective said quadrant, said each quadrant being testable from said test probe head in a single probing.

4. A test probe head as in claim 2, wherein said probe head substrate is for testing a selected wafer, said selected wafer having a given number of die, each of said plurality of chip test sites being at one said die, the whole of said selected wafer being testable from said test probe head in a single probing.

5. A test probe head as in claim 1, said array pads in each subarray being on a pitch at or less than fifty microns (50 μm).

6. A test probe head as in claim 1, wherein the attached probe tips have an across the head tip height variation of less than one micrometer (1 μm).

7. A test probe head as in claim 1, said probe head substrate comprising:
   connect pads on a surface opposite said one surface;
   one or more through-silicon vias (TSVs), each connecting one of said connect pads to one of said probe tip attach pads; and
   a solder ball on each connect pad.

8. A test probe head as in claim 7, further comprising an interposer substrate, said probe head substrate being attached to the solder balls on said interposer substrate.

9. A test probe head as in claim 7, wherein said probe head substrate includes chip test logic driving one or more of said probe tip attach pads.

10. A test probe head as in claim 9, wherein said probe head substrate is one of a plurality of test head layers in a three dimensional (3D) test head.

11. A multi-chip test probe head comprising:
    a probe head substrate with a plurality of chip test sites;
    an array of probe tip attach pads on one surface of said probe head substrate, said array including a plurality of subarrays, said array pads in each subarray being in a respective one of said plurality of chip test sites; and
    a probe tip attached to each probe tip attach pad, said probe tip having a 1-25 μm tall prismic, conical, cylindrical or pyramidal shaped protrusion, wherein the attached probe tips have a hard cap covering the probe tip and an across the head tip height variation less than one micrometer (1 μm).

12. A multi-chip test probe head as in claim 11, wherein said probe head substrate is for testing a quadrant on a selected wafer, said selected wafer having a given number of die in each said quadrant, each of said plurality of chip test sites being at one said die in a respective said quadrant, said each quadrant being testable from said test probe head in a single probing.

13. A multi-chip test probe head as in claim 11, wherein said probe head substrate is for testing a selected wafer, said selected wafer having a given number of die, each of said plurality of chip test sites being at one said die, the whole of said selected wafer being testable from said test probe head in a single probing.

14. A multi-chip test probe head as in claim 11, said probe head substrate comprising:
    connect pads on a surface opposite said one surface;
    one or more through-silicon vias (TSVs), each connecting one of said connect pads to one of said probe tip attach pads; and
    a solder ball on each connect pad.

15. A multi-chip test probe head as in claim 14, further comprising an interposer substrate, said probe head substrate being attached to the solder balls on said interposer substrate.

16. A multi-chip test probe head as in claim 11, wherein said probe head substrate includes chip test logic driving one or more of said probe tip attach pads.

17. A multi-chip test probe head as in claim 16, wherein said probe head substrate is one of a plurality of test head layers in a three dimensional (3D) test head.

18. A multi-chip test probe head as in claim 11, said array pads in each subarray being on a pitch at or less than fifty microns (50 µm).

19. A test probe head as in claim 1, wherein said each attached probe tip further comprises a conductive plug covered by said hard cap and wherein said hard cap is nickel (Ni), cobalt (Co), iron (Fe), a suitable refractory metal or an alloy thereof, and said conductive plug is a copper plug.

20. A multi-chip test probe head as in claim 11, wherein said each attached probe tip further comprises a conductive plug covered by said hard cap and wherein said hard cap is nickel (Ni), cobalt (Co), iron (Fe), a suitable refractory metal or an alloy thereof, and said conductive plug is a copper plug.

* * * * *